(12) United States Patent
Huang et al.

(10) Patent No.: US 12,326,473 B2
(45) Date of Patent: Jun. 10, 2025

(54) ELECTRONIC FUSE DEVICE AND OPERATION METHOD THEREOF

(71) Applicant: Faraday Technology Corp., Hsinchu (TW)

(72) Inventors: Chi-Chou Huang, Hsinchu (TW); Yun-Chuan Teng, Hsinchu (TW); Yu-Tang Wang, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 18/534,727

(22) Filed: Dec. 11, 2023

(65) Prior Publication Data

US 2025/0037780 A1 Jan. 30, 2025

(30) Foreign Application Priority Data

Jul. 25, 2023 (TW) ................................ 112127759

(51) Int. Cl.
*G01R 31/3185* (2006.01)
*G11C 29/12* (2006.01)

(52) U.S. Cl.
CPC .. *G01R 31/31853* (2013.01); *G11C 29/12015* (2013.01)

(58) Field of Classification Search
CPC ............ G11C 29/12015; G11C 29/023; G11C 29/027; G01R 31/31816; G01R 31/31853
See application file for complete search history.

(56) References Cited

U.S. PATENT DOCUMENTS

| | | | |
|---|---|---|---|
| 5,666,368 A * | 9/1997 | Proulx | G01R 31/31853 714/719 |
| 5,969,653 A * | 10/1999 | Sachdev | H03M 1/108 341/120 |
| 7,397,714 B2 | 7/2008 | Nagai et al. | |
| 8,065,574 B1 * | 11/2011 | Cheng | G01R 31/31816 714/736 |
| 11,074,207 B1 | 7/2021 | Kim et al. | |
| 2005/0073345 A1* | 4/2005 | Schneider | G06F 11/1008 365/225.6 |
| 2009/0079439 A1* | 3/2009 | Kuo | G11C 17/18 324/550 |

(Continued)

FOREIGN PATENT DOCUMENTS

| | | |
|---|---|---|
| CN | 111352594 | 6/2020 |
| CN | 116126095 | 5/2023 |

(Continued)

*Primary Examiner* — Steve N Nguyen
(74) *Attorney, Agent, or Firm* — JCIPRNET (57) ABSTRACT

The disclosure provides an electronic fuse (eFuse) device and an operation method thereof. The eFuse device includes an eFuse, a readout circuit, a register, and a safety control device. The readout circuit reads out target data recorded by the eFuse to the register and the safety control device. The safety control device compares the target data provided by the readout circuit with the target data provided by the register to determine whether a soft error occurs in the target data stored in the register. When the soft error occurs in the target data stored in the register, the readout circuit reads out the target data recorded by the eFuse again to the register and the safety control device.

17 Claims, 10 Drawing Sheets

(56) References Cited

U.S. PATENT DOCUMENTS

| | | | | |
|---|---|---|---|---|
| 2010/0163756 A1* | 7/2010 | McPeak | ............ | G01R 31/31816 |
| | | | | 714/E11.002 |
| 2010/0244918 A1* | 9/2010 | Moyer | ............. | H03K 3/356156 |
| | | | | 327/261 |
| 2011/0121856 A1* | 5/2011 | Tseng | ............... | G01R 31/31816 |
| | | | | 326/35 |
| 2014/0317460 A1 | 10/2014 | Kleveland et al. | | |
| 2018/0306860 A1 | 10/2018 | Oster et al. | | |
| 2022/0108760 A1* | 4/2022 | Sinha | ..................... | G11C 29/14 |

FOREIGN PATENT DOCUMENTS

| | | |
|---|---|---|
| TW | 201642274 | 12/2016 |
| TW | M587824 | 12/2019 |

\* cited by examiner

ELECTRONIC FUSE DEVICE AND OPERATION METHOD THEREOF

CROSS-REFERENCE TO RELATED APPLICATION

This application claims the priority benefit of Taiwan application serial no. 112127759, filed on Jul. 25, 2023. The entirety of the above-mentioned patent application is hereby incorporated by reference herein and made a part of this specification.

BACKGROUND

Technical Field

The disclosure relates to an electronic circuit, and particularly relates to an electronic fuse device and an operation method thereof.

Description of Related Art

An electronic fuse (eFuse) is often used in various electronic circuits, such as a system on a chip (SoC) or other electronic circuits. For example, an integrated circuit (IC) may use the eFuse to store analog trimming data, system settings, a key for an encryption circuit, and/or other application data. Due to power saving reasons, after the IC is powered on, the IC first reads data (such as the analog trimming data and/or the system settings) from the eFuse, and then stores the data read from the eFuse in a transitory storage medium such as a register, for example, a D Flip Flop (DFF). A relevant functional circuit (such as an analog circuit and/or a system circuit) may use the data stored in the register to avoid frequently reading out data from the eFuse. However, single-event upsets (SEU) may occur in the register, resulting in errors in the data stored in the register (data read from the eFuse).

The SEU occurs for many reasons. For example, a large number of high-energy charged particles in a space environment may cause SEU in the IC. A complementary metal-oxide-semiconductor (CMOS) electronic component of the IC is irradiated by a magnetic field of the earth, cosmic rays, etc., causing potential state jumps ("0" becomes "1", or "1" becomes "0"). Generally speaking, SEU does not cause physical damage to the component. If SEU occurs in the register, such as the DFF, a soft error is caused in current data of the register, thereby causing malfunction of the IC. Such interference-related failure rates are generally referred to as the soft error rate (SER), and an industrial metric used to quantify the SER of circuits is referred to as the failure in time (FIT).

The previous protection mechanism for the register can only reduce the occurrence probability of SEU, but cannot completely avoid the soft errors caused by SEU. Once the soft error occurs, the system still malfunctions. If the soft error causes an error in the data in the register (the important data read from eFuse), safety concerns for human life and property are likely caused. For example, the soft error may cause a vehicle system to misoperate or deadlock, thereby causing safety concerns for human life and property. Therefore, how to prevent the soft error from occurring or how to repair the soft error in real time is one of many technical issues in this field.

SUMMARY

The disclosure provides an electronic fuse (eFuse) device and an operation method thereof, so as to repair a soft error in real time.

In an embodiment of the disclosure, the eFuse device includes an eFuse, a readout circuit, a first register, and a safety control device. The readout circuit is coupled to the eFuse. The readout circuit reads out target data recorded by the eFuse based on the trigger of a clock signal. The first register is coupled to the readout circuit. The readout circuit stores the target data from the eFuse in the first register. The safety control device is coupled to the readout circuit to receive and store the target data from the eFuse. The safety control device is coupled to the first register to receive the target data stored in the first register. The safety control device compares the target data provided by the readout circuit with the target data provided by the first register to obtain a comparison result. The safety control device determines whether a soft error occurs in the target data stored in the first register based on the comparison result. In response to the soft error occurring in the target data stored in the first register, the readout circuit reads out the target data recorded by the eFuse again based on the clock signal, and the readout circuit again stores the target data from the eFuse in the first register and the safety control device respectively.

In an embodiment of the disclosure, the operation method includes the following. Target data recorded by an eFuse of an eFuse device is read out based on the trigger of a clock signal by a readout circuit of the eFuse device. The target data from the eFuse is stored respectively in a first register of the eFuse device and a safety control device of the eFuse device by the readout circuit. The target data provided by the readout circuit are compared with the target data provided by the first register by the safety control device to obtain a comparison result, and whether a soft error occurs in the target data stored in the first register is determined based on the comparison result. In response to the soft error occurring in the target data stored in the first register, reading out the target data recorded by the eFuse again based on the clock signal by the readout circuit, and again storing the target data from the eFuse in the first register and the safety control device respectively by the readout circuit.

Based on the above, after being powered-on, besides storing the target data from the eFuse in the first register by the readout circuit, the readout circuit also stores the same target data in the safety control device. After completing reading out the data of the eFuse, the readout circuit may stop the readout operation to reduce power consumption. The safety control device may regularly or irregularly compare the target data previously stored in the safety control device (the target data previously provided by the readout circuit) with the current target data provided by the first register to determine whether the soft error occurs in the target data stored in the first register. When it is determined that no soft error occurs, the target data of the eFuse may be updated to the safety control device through the readout circuit regularly or irregularly. When it is determined that the soft error occurs in the target data stored in the first register, the readout circuit may immediately perform the readout operation to read out the target data recorded by the eFuse again to the first register and the safety control device respectively. Therefore, the wrong data stored in the first register may be repaired in real time.

In order to make the above-mentioned features and advantages of the disclosure more comprehensible, the following embodiments are described in detail together with the accompanying drawings.

DESCRIPTION OF THE EMBODIMENTS

The term "coupled (or connected)" used throughout the specification of the disclosure (including the appended claims) may refer to any direct or indirect means of connection. For example, if it is described in the text that the first device is coupled (or connected) to the second device, it should be interpreted as saying that the first device may be directly connected to the second device, or that the first device may be indirectly connected through other devices or some kind of connection means to the second device. The terms "first" and "second" mentioned throughout the specification of the disclosure (including the appended claims) are used to name elements, or to distinguish different embodiments or ranges, and are not used to limit the upper limit or the lower limit of the number of elements, nor is it used to limit the order of the elements. In addition, wherever possible, elements/members/operations with the same reference numerals used in the drawings and embodiments represent the same or similar parts. Elements/members/operations with the same reference numerals or the same terms used in different embodiments may be referred to each other for related descriptions.

Figure 1:
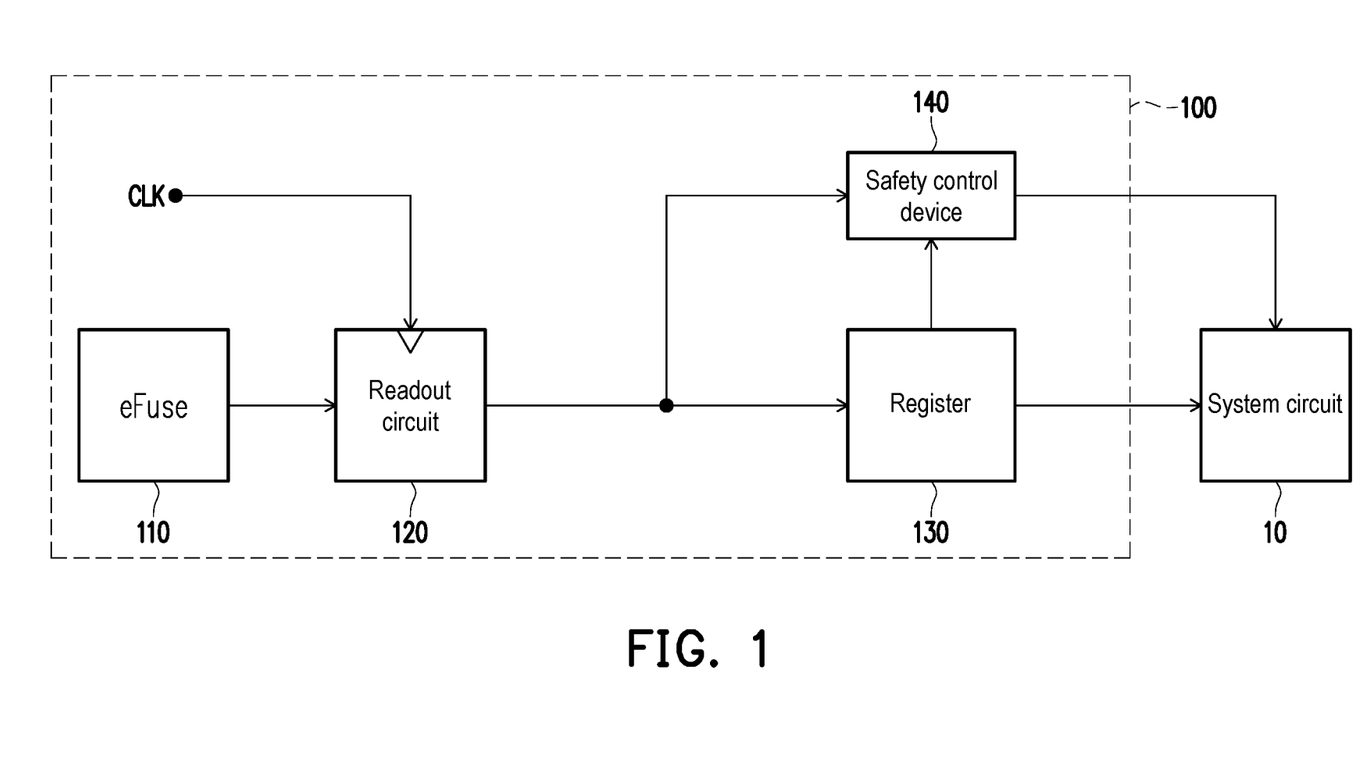
FIG. 1 is a circuit block schematic diagram of an electronic fuse (eFuse) device according to an embodiment of the disclosure.

FIG. 1 is a schematic diagram of a circuit block of an electronic fuse (eFuse) device 100 according to an embodiment of the disclosure. The eFuse device 100 shown in FIG. 1 may provide target data recorded in an eFuse to a system circuit 10. Based on actual application scenarios, the system circuit 10 may include a system on a chip (SoC) or other electronic circuits, and the target data may include analog trimming data, system settings, a key for an encryption circuit, and/or other application data. The system circuit 10 may use the target data provided by the eFuse device 100 to perform analog trimming, system setting, encryption, decryption, and/or other application operations.

The eFuse device 100 shown in FIG. 1 includes an eFuse 110, a readout circuit 120, a register 130, and a safety control device 140. According to different designs, in some embodiments, the implementation of the safety control device 140 may be a hardware circuit. In other embodiments, the implementation of the safety control device 140 may be a firmware, a software (i.e., a program), or a combination of the two. In still some other embodiments, the implementation of the safety control device 140 may be a combination of hardware, firmware, and software.

In terms of hardware, the safety control device 140 may be implemented in a logic circuit on an integrated circuit. For example, relevant functions of the safety control device 140 may be implemented in one or more controllers, microcontrollers, microprocessors, application-specific integrated circuits (ASICs), digital signal processors (DSPs), field programmable gate arrays (FPGAs), central processing units (CPUs), and/or various logic blocks, modules, and circuits in other processing units. The relevant functions of the safety control device 140 may be implemented as hardware circuits by using hardware description languages (such as Verilog HDL or VHDL) or other suitable programming languages, such as various logic blocks, modules, and circuits in integrated circuits.

In terms of software and/or firmware, the relevant functions of the safety control device 140 may be implemented as programming codes. For example, the safety control device 140 is implemented by using common programming languages (such as C, C++, or assembly language) or other suitable programming languages. The programming codes may be recorded/stored in a "non-transitory machine-readable storage medium". In some embodiments, the non-transitory machine-readable storage medium includes, for example, a semiconductor memory and/or a storage device. An electronic device (such as a computer, a CPU, a controller, a microcontroller, or a microprocessor) may read and execute the programming codes from the non-transitory machine-readable storage medium, so as to implement the relevant functions of the safety control device 140.

The readout circuit 120 is coupled to the eFuse 110. The readout circuit 120 reads out the target data recorded by the eFuse 110 based on the trigger of a clock signal CLK. This embodiment does not limit the implementation of the eFuse 110 and the readout circuit 120. For example, according to the actual design, the eFuse 110 may include the well-known eFuse or other fuses, and the readout circuit 120 may include the well-known eFuse readout circuit or other fuse readout circuit. The output terminal of the readout circuit 120 is coupled to the register 130 and the safety control device 140 so as to store the same target data from the eFuse 110 in the register 130 and the safety control device 140. After completing reading out the data of the eFuse 110, the readout circuit 120 may stop the readout operation to reduce power consumption.

According to the actual design, the register 130 may include a D Flip Flop (DFF) or other transitory storage mediums. The system circuit 10 may use the target data stored in the register 130 to perform various application operations. Therefore, the eFuse device 100 may avoid frequently reading out the target data from the eFuse 110. However, single-event upsets (SEU) may occur in the register 130, resulting in errors in the data stored in the register 130 (data read from the eFuse 110), that is, a soft error occurs in the register 130. If the soft error causes an error in the data in the register 130, safety concerns for human life and property are likely caused. For example, the soft error cause a vehicle system to misoperate or deadlock, thereby causing safety concerns for human life and property. Therefore, determining the correctness of the data in the register 130 in real time can greatly increase the safety of the system circuit 10 (such as the vehicle system).

The following embodiments will illustrate many implementation examples of the safety control device 140. When the soft error occurs in the register, the safety control device 140 can promptly perform repair on the data and/or notify the system circuit 10. Based on the notification from the safety control device 140, the system circuit 10 can also confirm the repaired result.

Figure 2:
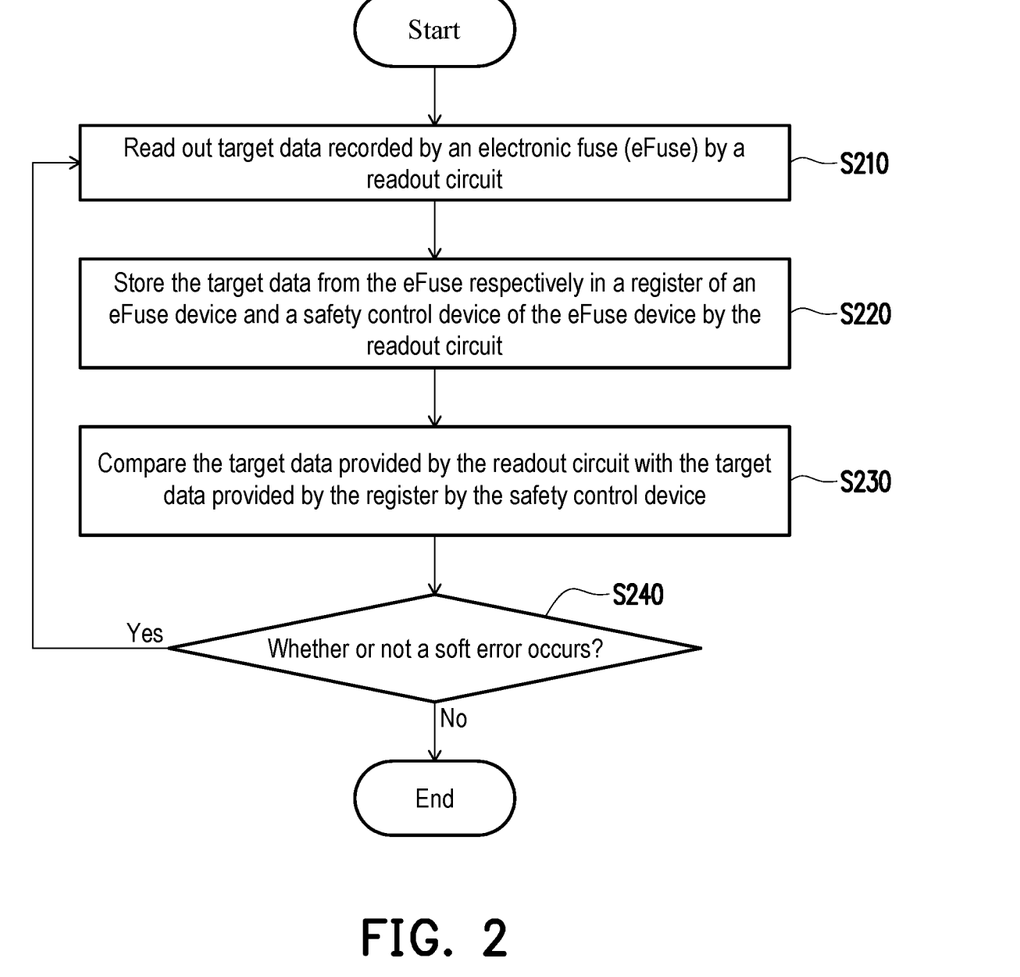
FIG. 2 is a schematic flowchart of an operation method of an eFuse device according to an embodiment of the disclosure.

FIG. 2 is a schematic flowchart of an operation method of an eFuse device according to an embodiment of the disclosure. The flow shown in FIG. 2 may be regarded as an iteration in the iterative operation. Please refer to FIG. 1 and FIG. 2. The safety control device 140 may execute the flow shown in FIG. 2 regularly or irregularly, so as to ensure that the target data stored in the register 130 is the correct data in real time. In Step S210, the readout circuit 120 may read out the target data recorded by the eFuse 110 based on the trigger of the clock signal CLK. In Step S220, the readout circuit 120 may store the target data from the eFuse 110 in the register 130 and the safety control device 140.

The safety control device 140 is coupled to the register 130 to receive the target data stored in the register 130. In Step S230, the safety control device 140 may compare the target data provided by the readout circuit 120 with the target data provided by the register 130 to obtain a comparison result. The safety control device 140 may keep comparing the data to determine whether the soft error occurs. The safety control device 140 may determine whether the soft error occurs in the target data stored in the register 130 based on the comparison result. That is, the safety control device 140 may regularly or irregularly compare the target data previously stored in the safety control device 140 (the target data previously provided by the readout circuit 120) with the current target data provided by the register 130, so as to determine whether the soft error occurs in the target data stored in the register 130 in real time.

In response to the soft error occurring in the target data stored in the register 130 (the determined result of Step S240 is "Yes"), the readout circuit 120 reads out the target data recorded by the eFuse 110 again based on the clock signal CLK (Step S210), and the readout circuit 120 again stores the same target data from the eFuse 110 in the register 130 and the safety control device 140 (Step S220). The safety control device 140 again compares the target data provided by the readout circuit 120 with the target data provided by the register 130 (Step S230). When it is determined that no soft error occurs in the target data stored in the register 130 (the determined result of Step S240 is "No"), the target data of the eFuse 110 is updated to the safety control device 140 through the readout circuit 120 and the iteration ends.

This embodiment does not limit a trigger mechanism (a control mechanism) for the readout circuit 120 to again perform the readout operation on the eFuse 110. According to the actual design, in some embodiments, the readout circuit 120 may be controlled by the system circuit 10. In response to the target data stored in the register 130 being determined that the soft error occurs, the safety control device 140 may notify the system circuit 10 to trigger the system circuit 10 to control the readout circuit 120 to read out the target data recorded by the eFuse 110 again to the register 130 and the safety control device 140.

In some other embodiments, the readout circuit 120 may be controlled by the safety control device 140. In response to the target data stored in the register 130 being determined that the soft error occurs, the safety control device 140 may control the readout circuit 120 to read out the target data recorded by the eFuse 110 again to the register 130 and the safety control device 140. In some actual designs, in response to the target data stored in the register 130 being determined that the soft error occurs, the safety control device 140 may further send a warning to the system circuit 10.

Based on the above, after being powered-on, besides storing the target data from the eFuse 110 in the register 130 by the readout circuit 120, the readout circuit 120 also stores the same target data in the safety control device 140. After completing reading out the data of the eFuse 110, the readout circuit 120 may stop the readout operation to reduce power consumption. The safety control device 140 may regularly or irregularly compare the target data previously stored in the safety control device 140 (the target data previously provided by the readout circuit 120) with the current target data provided by the register 130 to determine whether the soft error occurs in the target data stored in the register 130. When it is determined that no soft error occurs, the target data of the eFuse 110 may be updated to the safety control device 140 through the readout circuit 120 regularly or irregularly. When it is determined that the soft error occurs in the target data stored in the register 130, the readout circuit 120 immediately performs the readout operation to read the target data from the eFuse 110 again to the register 130 and the safety control device 140. Therefore, the wrong data stored in the register 130 may be repaired in real time.

Figure 3:
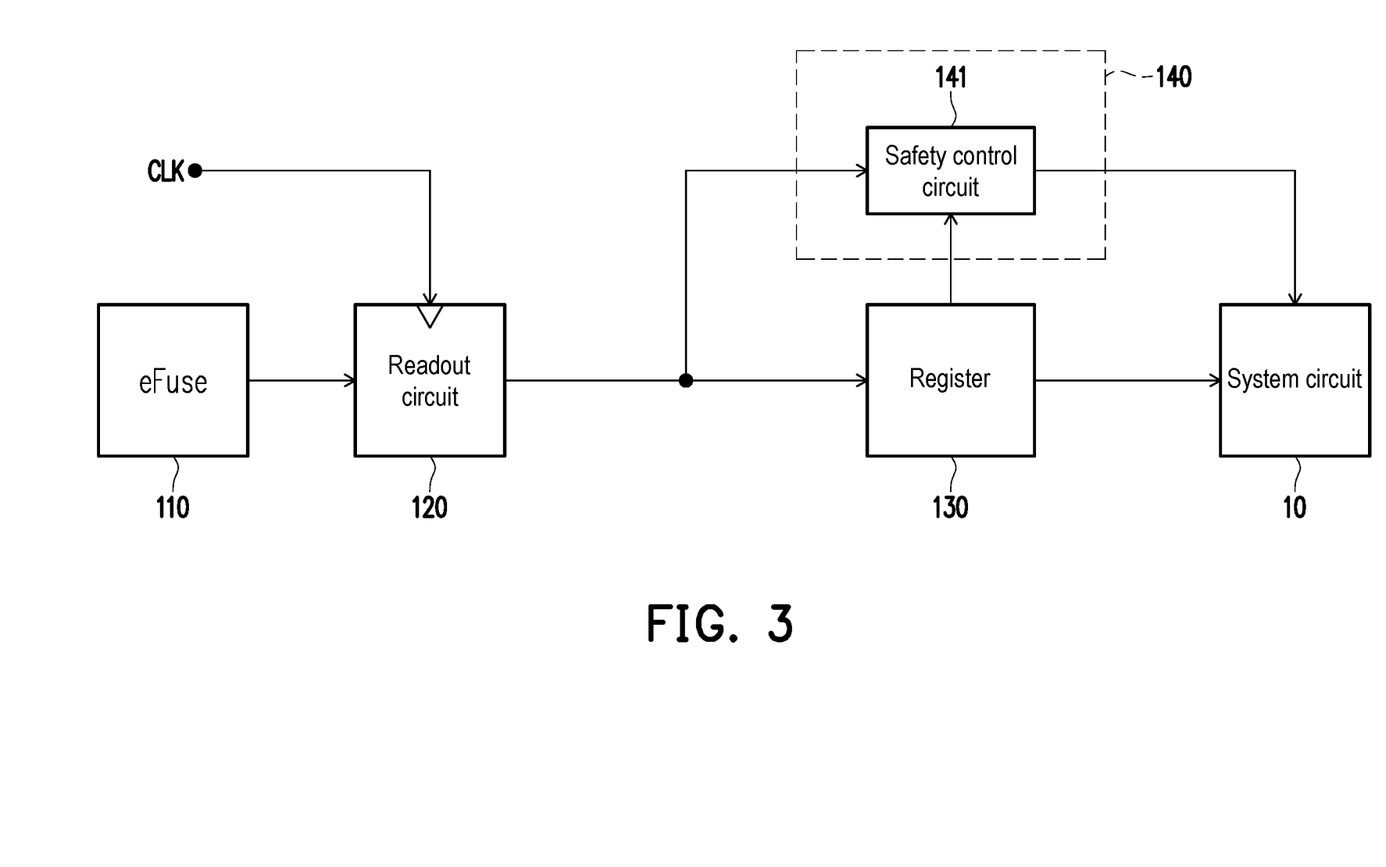
FIG. 3 is a schematic circuit block diagram of a safety control device according to an embodiment of the disclosure.

FIG. 3 is a schematic circuit block diagram of the safety control device 140 according to an embodiment of the disclosure. The safety control device 140 shown in FIG. 3 may be used as one of many implementation examples of the safety control device 140 shown in FIG. 1. For the system circuit 10, the eFuse 110, the readout circuit 120, the register 130, and the safety control device 140 shown in FIG. 3, reference may be made to the relevant descriptions of the system circuit 10, the eFuse 110, the readout circuit 120, the register 130, and the safety control device 140 shown in FIG. 1, so details are not repeated here.

In the embodiment shown in FIG. 3, the safety control device 140 includes a safety control circuit 141. The safety control circuit 141 is coupled to the readout circuit 120 to receive and store the target data from the eFuse 110. The safety control circuit 141 is also coupled to the register 130 to receive the target data stored in the register 130. The safety control circuit 141 compares the target data previously stored in the safety control circuit 141 (the target data previously provided by the readout circuit 120) with the current target data provided by the register 130 to obtain the comparison result. The safety control circuit 141 may determine whether the soft error occurs in the target data stored in the register 130 based on the comparison result. When it is determined that the soft error occurs in the target data stored in the register 130, the readout circuit 120 reads out the target data recorded by the eFuse 110 again based on the clock signal CLK, and the readout circuit 120 again stores the target data from the eFuse 110 in the register 130 and the safety control circuit 141.

Figure 4:
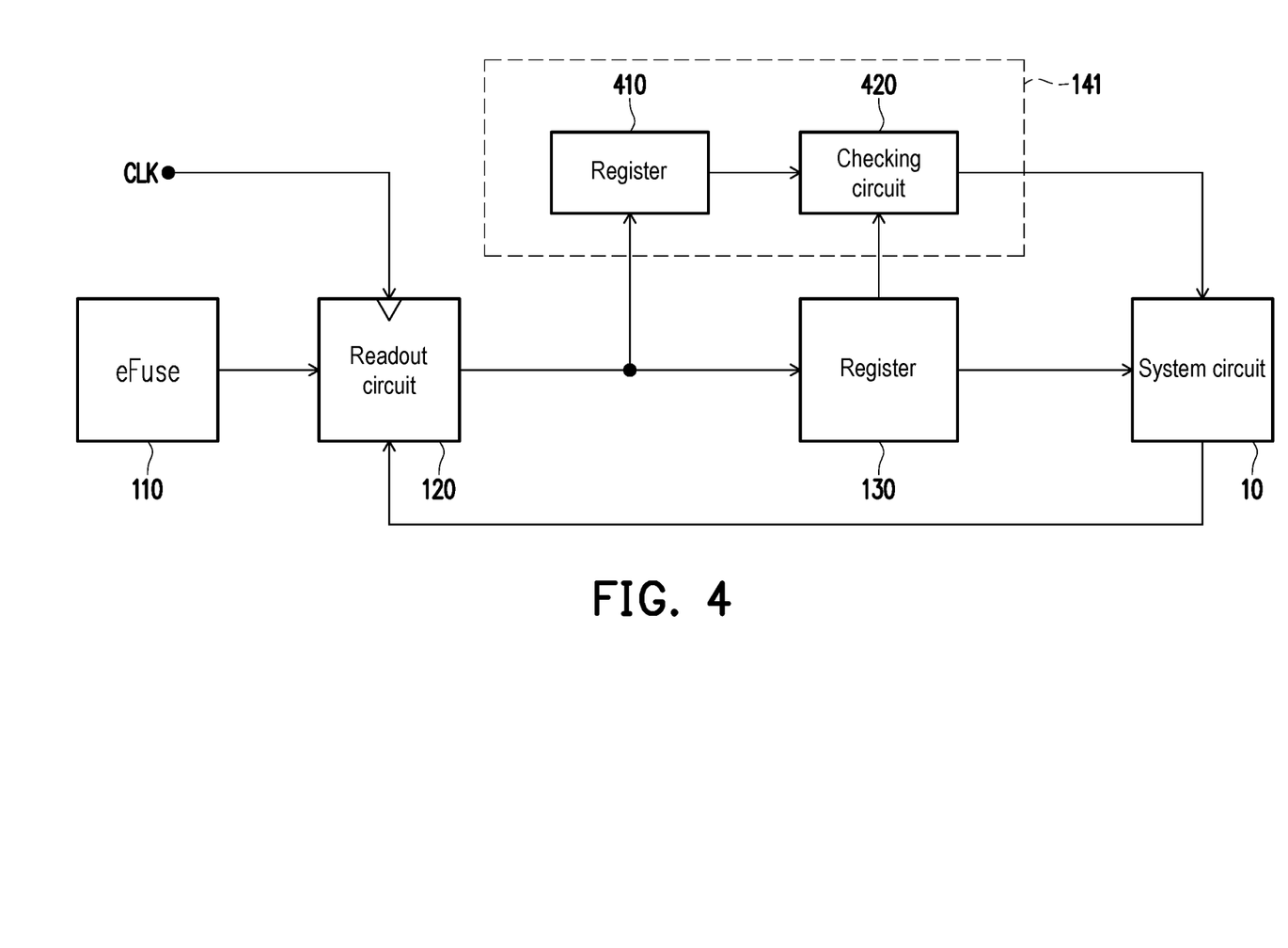
FIG. 4 is a schematic circuit block diagram of a safety control circuit according to an embodiment of the disclosure.

FIG. 4 is a schematic circuit block diagram of the safety control circuit 141 according to an embodiment of the disclosure. The safety control circuit 141 shown in FIG. 4 may be used as one of many implementation examples of the safety control circuit 141 shown in FIG. 3. For the system circuit 10, the eFuse 110, the readout circuit 120, and the register 130 shown in FIG. 4, reference may be made to the relevant descriptions of the system circuit 10, the eFuse 110, the readout circuit 120, and the register 130 shown in FIG. 1 or FIG. 3, so details are not repeated here. In the embodiment shown in FIG. 4, the safety control circuit 141 includes a register 410 and a checking circuit 420. The register 410 is coupled to the readout circuit 120 to receive and store the target data from the eFuse 110. After providing the data of the eFuse 110 to the registers 130 and 410, the readout circuit 120 may stop the readout operation to reduce power consumption.

The checking circuit 420 is coupled to the registers 130 and 410. The checking circuit 420 may compare the target data provided by the register 410 with the target data provided by the register 130 to obtain the comparison result. The checking circuit 420 may determine whether the soft error occurs in the target data stored in the register 130 based on the comparison result. In the embodiment shown in FIG. 4, the readout circuit 120 is controlled by the system circuit 10. When it is determined that no soft error occurs, the system circuit 10 may control the readout circuit 120 to update the target data of the eFuse 110 to the register 410. When the soft error occurs in the target data stored in the register 130, the checking circuit 420 may notify the system circuit 10 to trigger the system circuit 10 to control the readout circuit 120 to read out the target data recorded by the eFuse 110 again to the registers 130 and 410.

Figure 5:
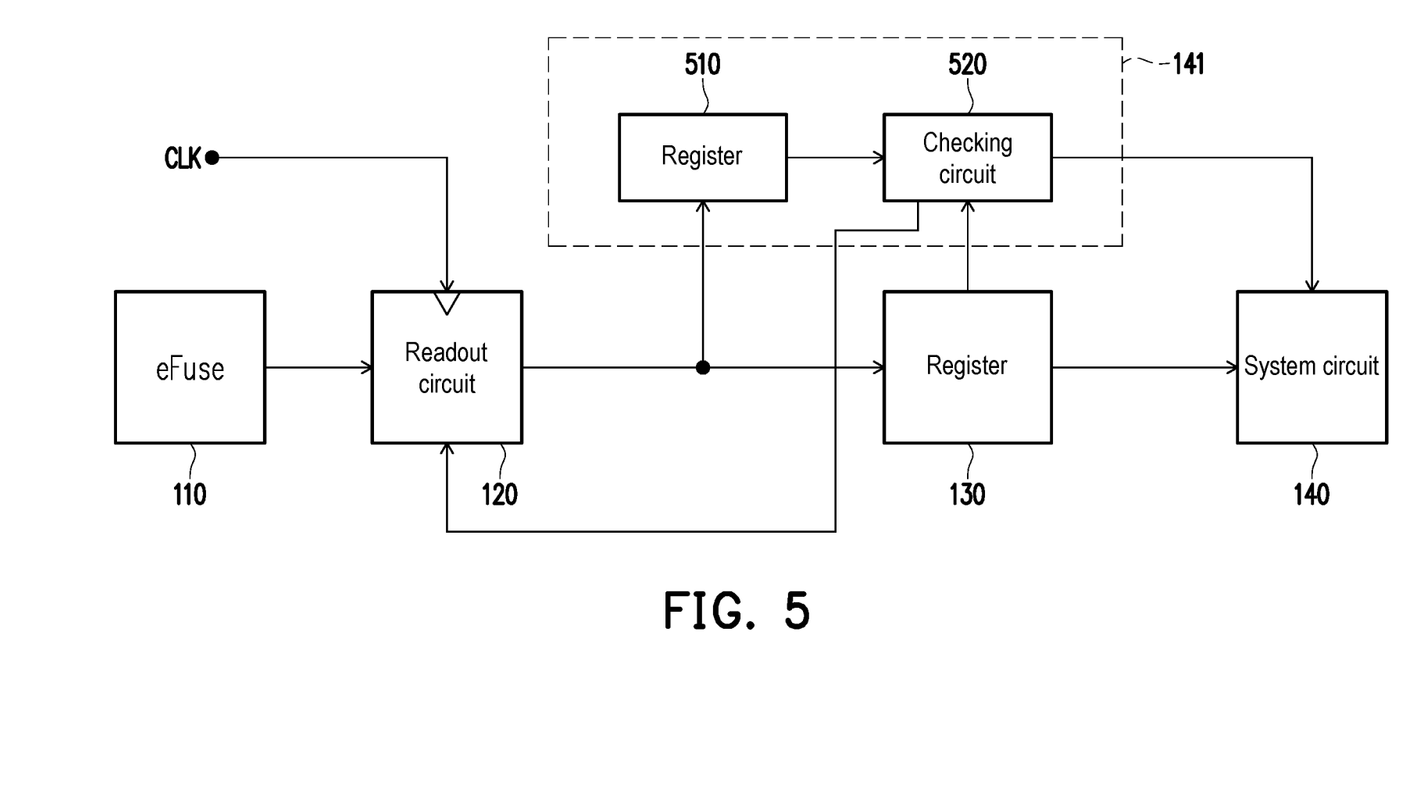
FIG. 5 is a schematic circuit block diagram of a safety control circuit according to another embodiment of the disclosure.

FIG. 5 is a schematic circuit block diagram of the safety control circuit 141 according to another embodiment of the disclosure. The safety control circuit 141 shown in FIG. 5 may be used as one of many implementation examples of the safety control circuit 141 shown in FIG. 3. For the system circuit 10, the eFuse 110, the readout circuit 120, and the register 130 shown in FIG. 5, reference may be made to the relevant descriptions of the system circuit 10, the eFuse 110, the readout circuit 120, and the register 130 shown in FIG. 1 or FIG. 3, so details are not repeated here. In the embodiment shown in FIG. 5, the safety control circuit 141 includes a register 510 and a checking circuit 520.

For the register 510 and the checking circuit 520 shown in FIG. 5, reference may be made to the relevant descriptions of the register 410 and the checking circuit 420 shown in FIG. 4, so details are not repeated here. The difference from the embodiment shown in FIG. 4 is that, in the embodiment shown in FIG. 5, the readout circuit 120 is controlled by the checking circuit 520. When it is determined that no soft error occurs, the checking circuit 520 may control the readout circuit 120 to update the target data of the eFuse 110 to the register 510. When the soft error occurs in the target data stored in the register 130, the checking circuit 520 may control the readout circuit 120 to read out the target data recorded by the eFuse 110 again to the registers 130 and 510. In some actual designs, in response to the soft error occurring in the target data stored in the register 130, the checking circuit 520 may further send a warning to the system circuit 10.

Figure 6:
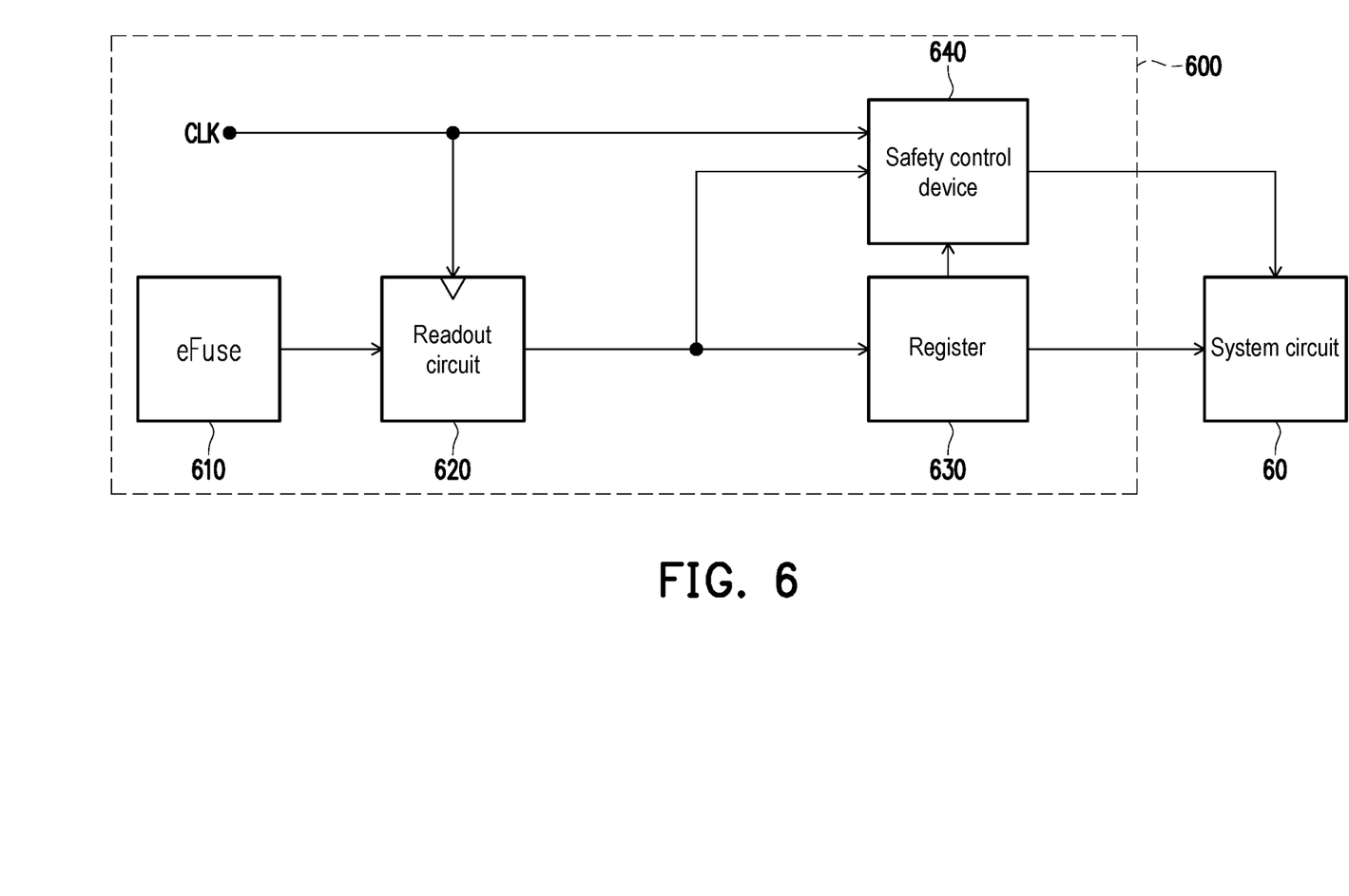
FIG. 6 is a schematic circuit block diagram of an eFuse device according to another embodiment of the disclosure.

FIG. 6 is a schematic circuit block diagram of an eFuse device 600 according to another embodiment of the disclosure. The eFuse device 600 shown in FIG. 6 may provide the target data recorded in the eFuse to a system circuit 60. In the embodiment shown in FIG. 5, the eFuse device 600 includes an eFuse 610, a readout circuit 620, a register 630, and a safety control device 640. For the system circuit 60, the eFuse device 600, the eFuse 610, the readout circuit 620, the register 630, and the safety control device 640 shown in FIG. 6, reference may be made to the relevant descriptions of the system circuit 10, the eFuse device 100, the eFuse 110, the readout circuit 120, the register 130, and the safety control device 140 and may be analogized, so details are not repeated here. The difference from the embodiment shown in FIG. 1 is that, in the embodiment shown in FIG. 6, the safety control device 640 may also check the clock signal CLK configured to trigger the readout circuit 620.

Figure 7:
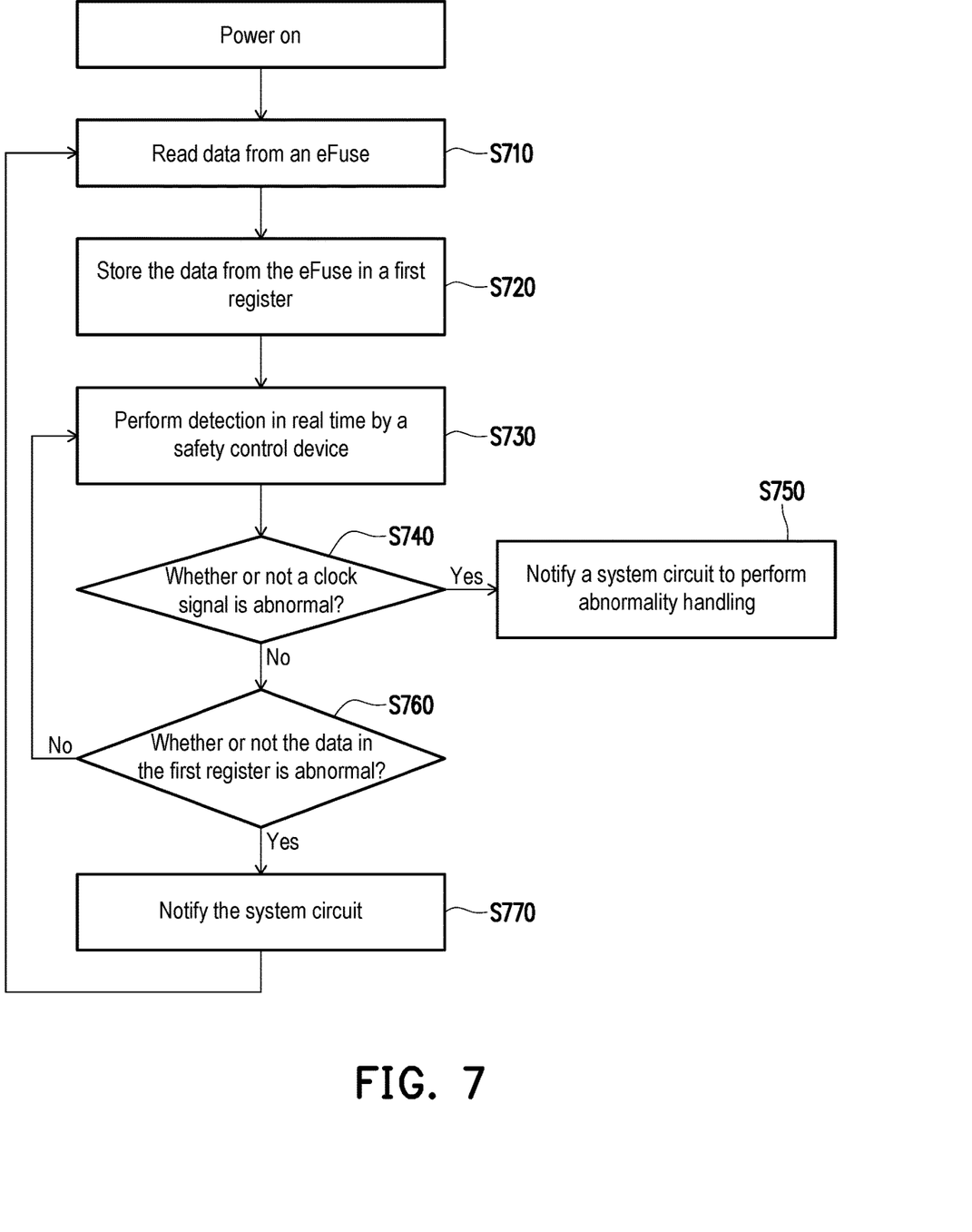
FIG. 7 is a schematic flowchart of an operation method of an eFuse device according to another embodiment of the disclosure.

FIG. 7 is a schematic flowchart of an operation method of an eFuse device according to another embodiment of the disclosure. Please refer to FIG. 6 and FIG. 7. In Step S710, the readout circuit 620 may read out the target data recorded by the eFuse 610 based on the trigger of the clock signal CLK. In Step S720, the readout circuit 620 may store the target data from the eFuse 610 in the register 630 (a first register) and the safety control device 640. After providing the data of the eFuse 110 to the register 630 and the safety control device 640, the readout circuit 620 may stop the readout operation to reduce power consumption.

In Step S730, the safety control device 640 may perform detection on the clock signal CLK and the register 630 in real time. The safety control device 640 may check the clock signal CLK to determine whether the target data read by the readout circuit 620 from the eFuse 610 is correct. This implementation does not limit the operation mode of checking the clock signal CLK. For example, the safety control device 640 may check whether the clock signal CLK is toggled, and/or check whether the frequency (or the period) of the clock signal CLK is correct. The safety control device 640 may determine whether the clock signal CLK is abnormal in Step S740. For example, when the clock signal CLK is stopped, or when the frequency (or the period) of the clock signal CLK falls outside the range of ±10% of the rated frequency (or the rated period), the safety control device 640 may determine that the clock signal CLK is abnormal. In response to the target data read by the readout circuit 620 from the eFuse 610 being determined to be incorrect, that is, when the clock signal CLK is determined to be abnormal (the determined result of Step S740 is "Yes"), the safety control device 640 sends a warning to the system circuit 60 to notify the system circuit 60 to perform abnormality handling (Step S750).

When the clock signal CLK does not stop, and when the frequency (or the period) of the clock signal CLK falls within the range of ±10% of the rated frequency (or the rated period), the safety control device 640 may determine that the clock signal CLK is not abnormal. In response to the target data read by the readout circuit 620 from the eFuse 610 being determined to be correct, that is, when the clock signal CLK is determined to be not abnormal (the determined result of Step S740 is "No"), the safety control device 640 may determine whether the soft error occurs in the target data stored in the register 630 in Step S760. In response to no soft error occurring in the target data stored in the register 630, that is, when the data in the register 630 is determined to be not abnormal (the determined result of Step S760 is "No"), the target data of the eFuse 610 is updated to the safety control device 640 through the readout circuit 620 and return to Step S730. In response to the soft error occurring in the target data stored in the register 630, that is, when the data in the register 630 is determined to be abnormal (the determined result of Step S760 is "Yes"), the safety control device 640 may send a notification to the system circuit 60 (Step S770). Return to Step S710 after completing Step S770.

Figure 8:
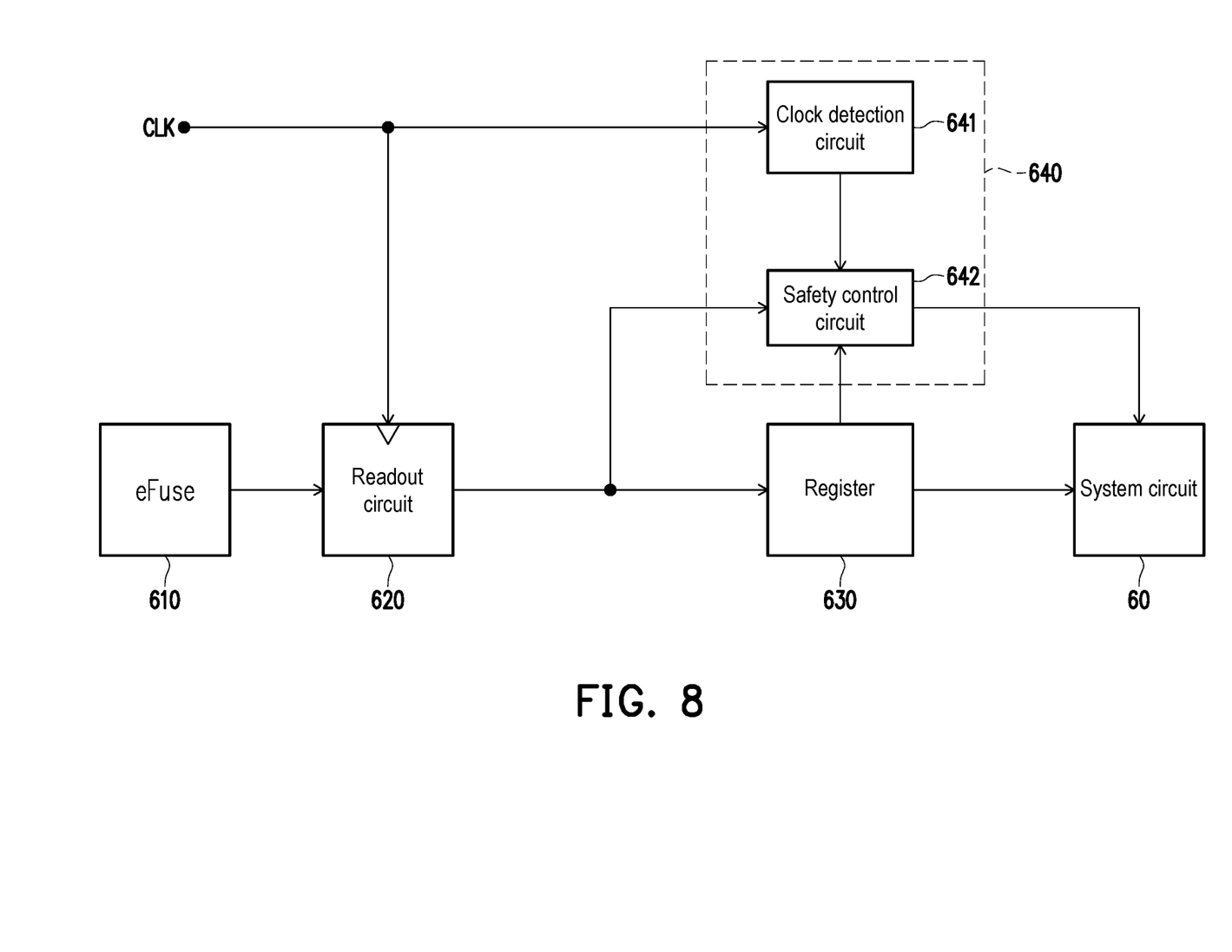
FIG. 8 is a schematic circuit block diagram of a safety control device according to another embodiment of the disclosure.

FIG. 8 is a schematic circuit block diagram of the safety control device 640 according to another embodiment of the disclosure. The safety control device 640 shown in FIG. 8 may be used as one of many implementation examples of the safety control device 640 shown in FIG. 6. For the system circuit 60, the eFuse 610, the readout circuit 620, the register 630, and the safety control device 640 shown in FIG. 8, reference may be made to the relevant descriptions of the system circuit 60, the eFuse 610, the readout circuit 620, the register 630, and the safety control device 640 shown in FIG. 6, so details are not repeated here.

In the embodiment shown in FIG. 8, the safety control device 640 includes a clock detection circuit 641 and a safety control circuit 642. The clock detection circuit 641 is coupled to the safety control circuit 642. The clock detection circuit 641 checks the clock signal CLK configured to trigger the readout circuit 620. The clock detection circuit 641 provides a check result of the clock signal CLK to the safety control circuit 642. The safety control circuit 642 determines whether the target data read by the readout circuit 620 from the eFuse 610 is correct based on the check result. In response to the target data read by the readout circuit 620 from the eFuse 610 being determined to be correct, and in response to the soft error occurring in the target data stored in the register 630, the safety control circuit 640 sends a notification to the system circuit 60 (Step S770). In response to the target data read by the readout circuit 620 from the eFuse 610 being determined to be incorrect, the safety control circuit 640 sends a warning to the system circuit 60 (Step S750). The safety control circuit 642 of this embodiment is used with the clock detection circuit 641 to ensure the normal operation of the safety control circuit 642. If the clock detection circuit 641 finds an abnormality, the safety control circuit 642 can promptly notify the system circuit 60 to perform warning or repairing.

Figure 9:
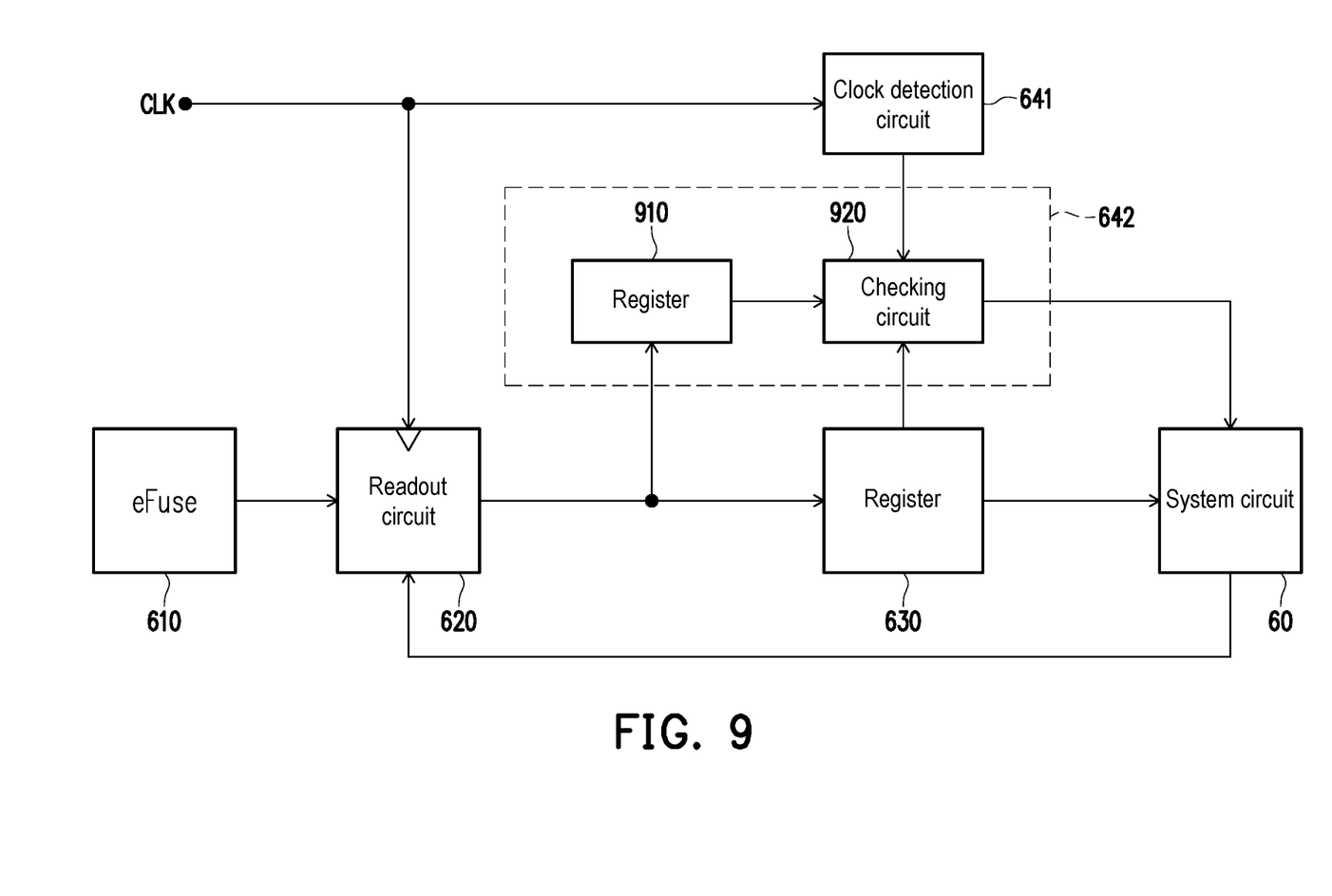
FIG. 9 is a schematic circuit block diagram of a safety control circuit according to an embodiment of the disclosure.

FIG. 9 is a schematic circuit block diagram of the safety control circuit 642 according to an embodiment of the disclosure. The safety control circuit 642 shown in FIG. 9 may be used as one of many implementation examples of the safety control circuit 642 shown in FIG. 8. For the system circuit 60, the eFuse 610, the readout circuit 620, and the register 630 shown in FIG. 9, reference may be made to the relevant descriptions of the system circuit 60, the eFuse 610, the readout circuit 620, and the register 630 shown in FIG. 6 or FIG. 8, so details are not repeated here. In the embodiment shown in FIG. 9, the safety control circuit 642 includes a register 910 and a checking circuit 920. The register 910 is coupled to the readout circuit 620 to receive and store the target data from the eFuse 610. After providing the data of the eFuse 610 to the registers 630 and 910, the readout circuit 620 may stop the readout operation to reduce power consumption.

The checking circuit 920 is coupled to the clock detection circuit 641 and the registers 630 and 910. In response to the target data read by the readout circuit 620 from the eFuse 610 being determined to be correct, that is, when the clock signal CLK is determined to be not abnormal, the checking circuit 920 may compare the target data provided by the register 910 with the target data provided by the register 630 to obtain the comparison result. The checking circuit 920 may determine whether the soft error occurs in the target data stored in the register 630 based on the comparison result. In the embodiment shown in FIG. 9, the readout circuit 620 is controlled by the system circuit 60. When it is determined that no soft error occurs, the system circuit 60 may control the readout circuit 620 to update the target data of the eFuse 610 to the register 910. When the soft error occurs in the target data stored in the register 630, the checking circuit 920 may notify the system circuit 60 to trigger the system circuit 60 to immediately control the readout circuit 620 to read out the target data recorded by the eFuse 610 again to the registers 630 and 910 respectively.

Figure 10:
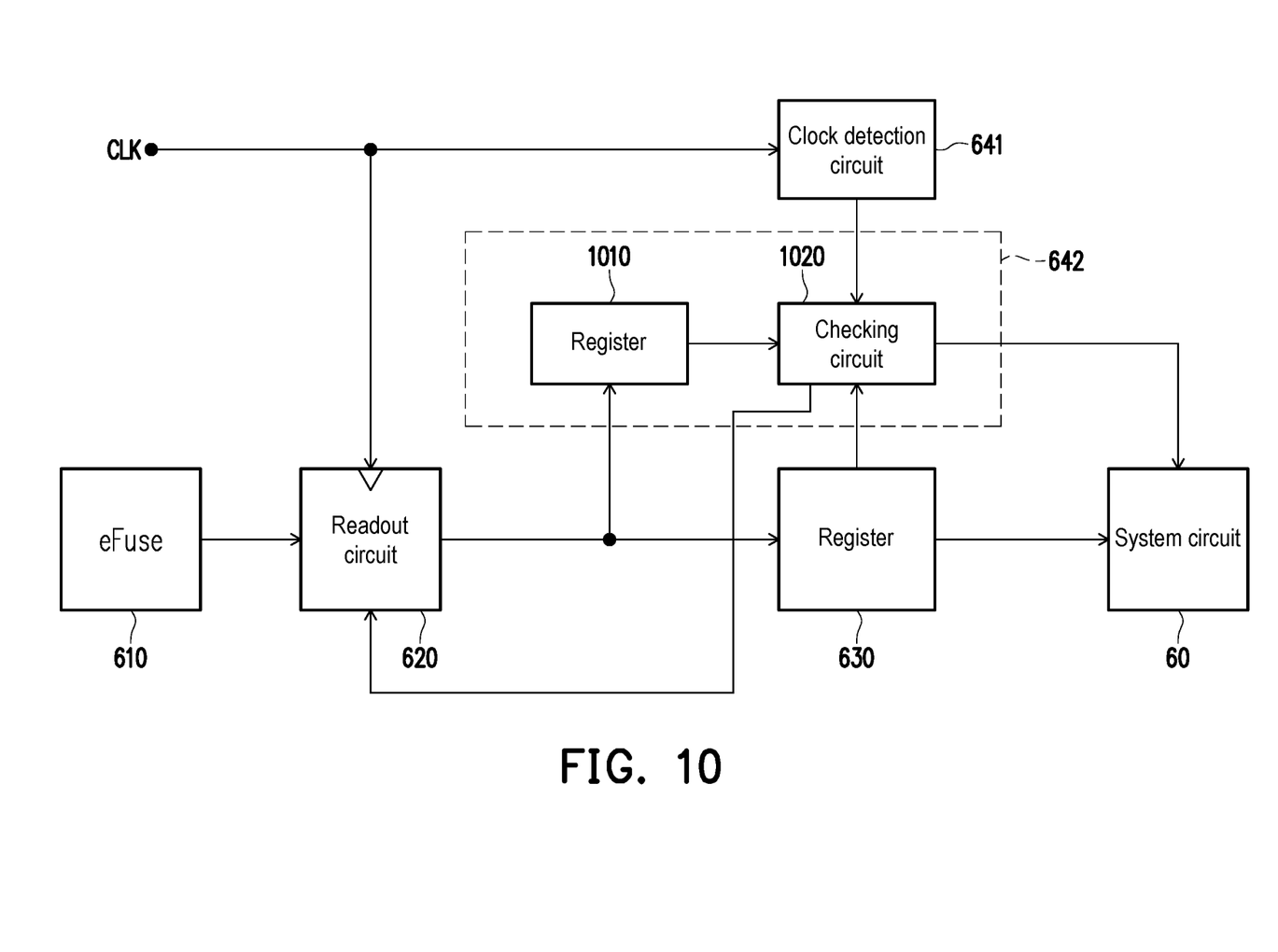
FIG. 10 is a schematic circuit block diagram of a safety control circuit according to still another embodiment of the disclosure.

FIG. 10 is a schematic circuit block diagram of the safety control circuit 642 according to still another embodiment of the disclosure. The safety control circuit 642 shown in FIG. 10 may be used as one of many implementation examples of the safety control circuit 642 shown in FIG. 8. For the system circuit 60, the eFuse 610, the readout circuit 620, and the register 630 shown in FIG. 10, reference may be made to the relevant descriptions of the system circuit 60, the eFuse 610, the readout circuit 620, and the register 630 shown in FIG. 6 or FIG. 8, so details are not repeated here. In the embodiment shown in FIG. 10, the safety control circuit 642 includes a register 1010 and a checking circuit 1020.

For the register 1010 and the checking circuit 1020 shown in FIG. 10, reference may be made to the relevant descriptions of the register 910 and the checking circuit 920 shown in FIG. 9, so details are not repeated here. The difference from the embodiment shown in FIG. 9 is that, in the embodiment shown in FIG. 10, the readout circuit 620 is controlled by the checking circuit 1020. When it is determined that no soft error occurs, the checking circuit 1020 may control the readout circuit 620 to update the target data of the eFuse 610 to the register 1010. When the soft error occurs in the target data stored in the register 630, the checking circuit 1020 may control the readout circuit 620 to read out the target data recorded by the eFuse 610 again to the registers 630 and 1010. In some actual designs, in response to the soft error occurring in the target data stored in the register 630, the checking circuit 1020 may further send a warning to the system circuit 60.

In summary, the above-mentioned embodiments propose the safety control circuit for the eFuse content to determine the correctness of the eFuse content in real time. The safety control circuit is also embedded with the clock detection circuit to determine the normal operation of the safety control circuit. Even if the soft error occurs in the system, the safety control circuit can perform repairing on the data in the register to avoid the abnormality or deadlock occurring in the system, and at the same time notify the system of the occurrence of a soft error event and perform system confirmation.

Although the disclosure has been disclosed above with the embodiments, the embodiments are not intended to limit the disclosure. Persons with ordinary knowledge in the technical field may make some changes and modifications without departing from the spirit and scope of the disclosure. The scope of protection of the disclosure should be defined by the appended claims.

What is claimed is:

1. An electronic fuse (eFuse) device, comprising:
   an eFuse;
   a readout circuit coupled to the eFuse, wherein the readout circuit reads out target data recorded by the eFuse based on a trigger of a clock signal;
   a first register coupled to the readout circuit, wherein the readout circuit stores the target data from the eFuse in the first register; and
   a safety control device coupled to the readout circuit to receive and store the target data from the eFuse, and coupled to the first register to receive the target data stored in the first register, wherein
   the safety control device compares the target data provided by the readout circuit with the target data provided by the first register to obtain a comparison result, and determines whether a soft error occurs in the target data stored in the first register based on the comparison result; and
   in response to the soft error occurring in the target data stored in the first register, the readout circuit reads out the target data recorded by the eFuse again based on the clock signal, and the readout circuit again stores the target data from the eFuse in the first register and the safety control device respectively, wherein the safety control device checks the clock signal configured to trigger the readout circuit to determine whether the target data read by the readout circuit from the eFuse is correct;

in response to the target data read by the readout circuit from the eFuse being determined to be correct, and in response to the soft error occurring in the target data stored in the first register, the safety control device sends a notification to a system circuit; and in response to the target data read by the readout circuit from the eFuse being determined to be incorrect, the safety control device sends a warning to the system circuit, wherein checking the clock signal configured to trigger the readout circuit comprises:

checking whether the clock signal configured to trigger the readout circuit is toggled; or checking whether a frequency or a period of the clock signal configured to trigger the readout circuit is correct.

2. The eFuse device as claimed in claim 1, wherein, in response to the soft error occurring in the target data stored in the first register, the safety control device notifies a system circuit to trigger the system circuit to control the readout circuit to read out the target data recorded by the eFuse again to the first register and the safety control device.

3. The eFuse device as claimed in claim 1, wherein, in response to the soft error occurring in the target data stored in the first register, the safety control device controls the readout circuit to read out the target data recorded by the eFuse again to the first register and the safety control device.

4. The eFuse device as claimed in claim 3, wherein, in response to the soft error occurring in the target data stored in the first register, the safety control device further sends a warning to a system circuit.

5. An eFuse device comprising:

an eFuse;

a readout circuit coupled to the eFuse, wherein the readout circuit reads out target data recorded by the eFuse based on a trigger of a clock signal;

a first register coupled to the readout circuit, wherein the readout circuit stores the target data from the eFuse in the first register; and a safety control device coupled to the readout circuit to receive and store the target data from the eFuse, and coupled to the first register to receive the target data stored in the first register, wherein the safety control device comprises:

a safety control circuit coupled to the readout circuit to receive and store the target data from the eFuse, and coupled to the first register to receive the target data stored in the first register, wherein the safety control circuit compares the target data provided by the readout circuit with the target data provided by the first register to obtain a comparison result, and determines whether a soft error occurs in the target data stored in the first register based on the comparison result; and in response to the soft error occurring in the target data stored in the first register, the readout circuit reads out the target data recorded by the eFuse again based on the clock signal, and the readout circuit again stores the target data from the eFuse in the first register and the safety control circuit respectively, wherein the safety control device further comprises:

a clock detection circuit coupled to the safety control circuit, wherein the clock detection circuit checks the clock signal configured to trigger the readout circuit, the clock detection circuit provides a check result of the clock signal to the safety control circuit, and the safety control circuit determines whether the target data read by the readout circuit from the eFuse is correct, in response to the target data read by the readout circuit from the eFuse being determined to be correct, and in response to the soft error occurring in the target data stored in the first register, the safety control circuit sends a notification to a system circuit; and in response to the target data read by the readout circuit from the eFuse being determined to be incorrect, the safety control circuit sends a first warning to the system circuit.

6. The eFuse device as claimed in claim 5, wherein the safety control circuit comprises:

a second register coupled to the readout circuit to receive and store the target data from the eFuse; and a checking circuit coupled to the second register and the first register, wherein the checking circuit compares the target data provided by the second register with the target data provided by the first register to obtain the comparison result, and determines whether the soft error occurs in the target data stored in the first register based on the comparison result.

7. The eFuse device as claimed in claim 6, wherein, in response to the soft error occurring in the target data stored in the first register, the checking circuit notifies a system circuit to trigger the system circuit to control the readout circuit to read out the target data recorded by the eFuse again to the first register and the second register.

8. The eFuse device as claimed in claim 6, wherein, in response to the soft error occurring in the target data stored in the first register, the checking circuit controls the readout circuit to read out the target data recorded by the eFuse again to the first register and the second register.

9. The eFuse device as claimed in claim 8, wherein, the checking circuit further sends a warning to a system circuit in response to the soft error occurring in the target data stored in the first register.

10. The eFuse device as claimed in claim 5, wherein the safety control circuit comprises:

a second register coupled to the readout circuit to receive and store the target data from the eFuse; and a checking circuit coupled to the clock detection circuit, the second register, and the first register, wherein in response to the target data read by the readout circuit from the eFuse being determined to be correct, the checking circuit compares the target data provided by the second register with the target data provided by the first register to obtain the comparison result, and determines whether the soft error occurs in the target data stored in the first register based on the comparison result.

11. The eFuse device as claimed in claim 10, wherein in response to the soft error occurring in the target data stored in the first register, the checking circuit notifies a system circuit to trigger the system circuit to control the readout circuit to read out the target data recorded by the eFuse again to the first register and the second register.

12. The eFuse device as claimed in claim 10, wherein in response to the soft error occurring in the target data stored in the first register, the checking circuit controls the readout circuit to read out the target data recorded by the eFuse again to the first register and the second register.

13. The eFuse device as claimed in claim 12, wherein the checking circuit further sends a second warning to the system circuit in response to the soft error occurring in the target data stored in the first register.

14. An operation method of an eFuse device, comprising:
reading out target data recorded by an eFuse of the eFuse device based on a trigger of a clock signal by a readout circuit of the eFuse device;
storing the target data from the eFuse respectively in a first register of the eFuse device and a safety control device of the eFuse device by the readout circuit;
comparing the target data provided by the readout circuit with the target data provided by the first register by the safety control device to obtain a comparison result, and determining whether a soft error occurs in the target data stored in the first register based on the comparison result;
in response to the soft error occurring in the target data stored in the first register, reading out the target data recorded by the eFuse again based on the clock signal by the readout circuit, and again storing the target data from the eFuse in the first register and the safety control device respectively by the readout circuit,
checking the clock signal configured to trigger the readout circuit to determine whether the target data read by the readout circuit from the eFuse is correct;
in response to the target data read by the readout circuit from the eFuse being determined to be correct, and in response to the soft error occurring in the target data stored in the first register, sending a notification to a system circuit by the safety control device; and
in response to the target data read by the readout circuit from the eFuse being determined to be incorrect, sending a warning to the system circuit by the safety control device,
wherein checking the clock signal configured to trigger the readout circuit comprises:
checking whether the clock signal configured to trigger the readout circuit is toggled; or
checking whether a frequency or a period of the clock signal configured to trigger the readout circuit is correct.

15. The operation method as claimed in claim 14, further comprising:
in response to the soft error occurring in the target data stored in the first register, notifying a system circuit by the safety control device to trigger the system circuit to control the readout circuit to read out the target data recorded by the eFuse again to the first register and the safety control device.

16. The operation method as claimed in claim 14, further comprising:
in response to the soft error occurring in the target data stored in the first register, controlling the readout circuit by the safety control device to read out the target data recorded by the eFuse again to the first register and the safety control device.

17. The operation method as claimed in claim 16, further comprising:
in response to the soft error occurring in the target data stored in the first register, the safety control device sending a warning to a system circuit.

* * * * *